United States Patent [19]

Watanabe

[11] Patent Number: 4,592,073
[45] Date of Patent: May 27, 1986

[54] BURST SIGNAL TRANSMISSION SYSTEM

[75] Inventor: Kyoji Watanabe, Tokyo, Japan

[73] Assignee: NEC Corporation, Tokyo, Japan

[21] Appl. No.: 555,926

[22] Filed: Nov. 29, 1983

[30] Foreign Application Priority Data

Nov. 29, 1982 [JP] Japan .............................. 57-209019

[51] Int. Cl.[4] ............................................ H04L 25/49
[52] U.S. Cl. .................................... 375/60; 332/9 R; 332/37 D; 455/126
[58] Field of Search ...................... 375/58, 60, 68, 72, 375/73; 370/6, 9; 455/91, 126, 116; 331/172, 173; 332/9 R, 37 R, 37 D

[56] References Cited

U.S. PATENT DOCUMENTS

| 3,502,987 | 3/1970 | Newton | 375/60 |
| 3,553,695 | 1/1971 | Simon et al. | 455/91 |
| 3,662,290 | 5/1972 | Elliott | 455/126 |
| 3,727,149 | 4/1973 | Kimura | 331/173 |
| 3,900,823 | 8/1975 | Sokal et al. | 332/37 D |
| 4,286,236 | 8/1981 | Fisher | 332/9 R |
| 4,291,277 | 9/1981 | Davis et al. | 370/60 |
| 4,485,478 | 11/1984 | Takada | 375/60 |

Primary Examiner—Marc E. Bookbinder
Assistant Examiner—Stephen Chin
Attorney, Agent, or Firm—Sughrue, Mion, Zinn, Macpeak and Seas

[57] ABSTRACT

A signal control circuit for a burst signal transmission system has a comparator for receiving a burst control signal from a burst control signal generator and an output signal from an envelope detector and for generating a difference signal therebetween. The difference signal is supplied to an attenuator, a preamplifier or a nonlinear power amplifier for receiving a modulated carrier wave so as to control attenuation of the attenuator or gain of the preamplifier or nonlinear power amplifier whereby a waveform of the output signal from the nonlinear amplifier is made analogous to that of the burst control signal from the burst control signal generator.

7 Claims, 13 Drawing Figures

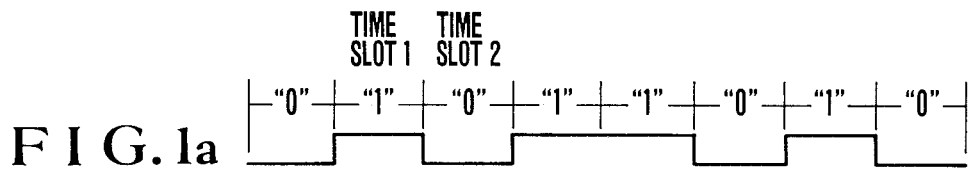
FIG. 1a
FIG. 1b
FIG. 1c
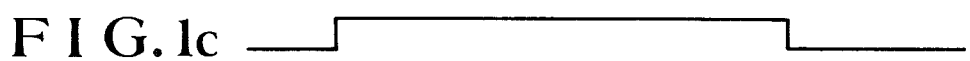
FIG. 1d

BURST SIGNAL TRANSMISSION SYSTEM

BACKGROUND OF THE INVENTION

I. Field of the Invention

The present invention generally relates to a burst signal transmission system and, more particularly, to a signal control circuit suitable for controlling a modulated carrier signal having a fixed envelope, for example, an output waveform from a nonlinear amplifier used for an FM (frequency modulation) or PM (phase modulation) in a time division multiple access (TDM) or time division multiple (TDMA) communication system.

II. Description of the Prior Art

Conventionally, phase shift keying (PSK) is well-known as a modulation scheme of a TDMA or TDM communication system. There are two reasons why the PSK scheme is frequently used in the TDMA OR TDM communication system. First, since according to the PSK modulation, coherent detection is effected in a receiving end, transmission characteristics are better than those of any other modulation scheme. Second, since waveform-shaping of a baseband signal is effected by means of, for example, a Nyquist filter in favor of effective utilization of the frequency band, easy burst control can be performed when the system is constituted with linear components. According to the PSK modulation, a carrier wave is modulated by a baseband signal having a limited bandwidth so as to have an envelope with smoothed node portions. Therefore, the burst control can be effected at the node portions so that the spectrum spread due to carrier switching can be suppressed to some extent.

However, since the PSK scheme is of a linear type as described above, a linear amplifier must be used as a power amplifier. The linear amplifier has an efficiency as low as a few percent, and is not suitable for a high power communication system.

On the other hand, when a modulaton scheme such as FM or PM which provides a fixed envelope without node portions is employed, a class C amplifier can be used as a power amplifier, thereby readily obtaining a high power communication system. However, when the modulated carrier with the fixed envelope is burst-switched in response to a rectangular wave, frequency spectrum spread occurs which not only interfers the other channels but also causes interaction between transmission and reception waves, thus adversely affecting a receiver set of the system per se.

SUMMARY OF THE INVENTION

It is, therefore, an object of the present invention to provide a signal control circuit for a burst signal control for a burst signal transmission system using a modulation scheme such as FM or PM which provides a fixed envelope, wherein for an output waveform of a nonlinear amplifier, burst control can be effected which can prevent frequency spectrum spread of the carrier wave under burst switching, thereby providing good frequency spectrum characteristics.

In order to achieve the above object of the present invention, there is provided a signal control circuit for a burst signal transmission system comprising: a main channel including a preamplifier for receiving a modulated carrier signal having a fixed envelope and a nonlinear amplifier for amplifying an output from the preamplifier; an envelope detector for detecting an envelope of an output signal from the nonlinear amplifier; a burst control signal generator for generating a burst control signal for the modulated carrier signal having smoothed leading and trailing edges; and control means, responsive to output signals of the envelope detector and burst control signal generator, for controlling the main channel so that a waveform of the output signal from the nonlinear amplifier is made analogous to that of the control signal from the burst control signal generator.

BRIEF DESCRIPTION OF THE DRAWINGS

FIGS. 1a to 1d show waveforms for explaining burst control in a PSK modulation scheme;

DETAILED DESCRIPTION OF THE PREFERRED EMBODIMENTS

Prior to describing preferred embodiments of the present invention, waveforms appearing in the PSK modulation and an FM or PM, and burst control relevant thereto and appearing waveforms will be described.

When a baseband signal passed through a Nyquist filter (roll-off filter) for waveform shaping and elimination of inter-symbol interference, as shown in FIG. 1a, is subjected to a PSK modulation, a resultant modulated waveform as shown in FIG. 1b is obtained which is similar to an AM signal, having smoothed node portions. More specifically, when two adjacent time slots 1 and 2, for example, in the baseband signal are allotted with a complementary pattern of "1" and "0", the amplitude of the carrier signal becomes zero at the time the time slot changes. It will therefore be seen readily that any interference with the carrier signal upon the change of the time slot will not affect the spectrum. A burst control signal of rectangular waveform as shown in FIG. 1c is then applied in response to the change of the time slot to produce an output signal as shown in FIG. 1d.

Figure 2A:
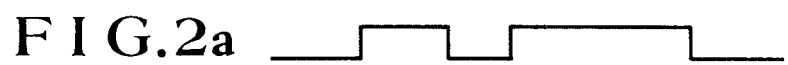
FIGS. 2a to 2e show waveforms for explaining burst control in a FM or PM scheme according to the present invention.
Figure 2B:

In contrast to the PSK modulation, according to the FM scheme, a baseband signal of FIG. 2a is modulated to produce a modulated signal as shown in FIG. 2b wherein the modulated carrier signal has no nodes at which the carrier signal becomes zero or disappears. Consequently, it is impossible to apply burst control in response to disappearance of the carrier signal, raising a particular problem in the FM scheme.

Figure 2C:
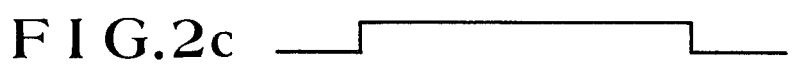

Under the application of a burst control signal of FIG. 2c for burst switching, the carrier signal amplitude abruptly changes at the leading and trailing edges thereof due to a steep discontinuity of the burst control signal, thus resulting in carrier frequency spectrum spread. In order to obtain a burst carrier spectrum which comes close to the continuous carrier spectrum, the leading and trailing edges of the carrier must be made smooth.

Preferred embodiments of the present invention will now be described with reference to the accompanying drawings.

Figure 3:
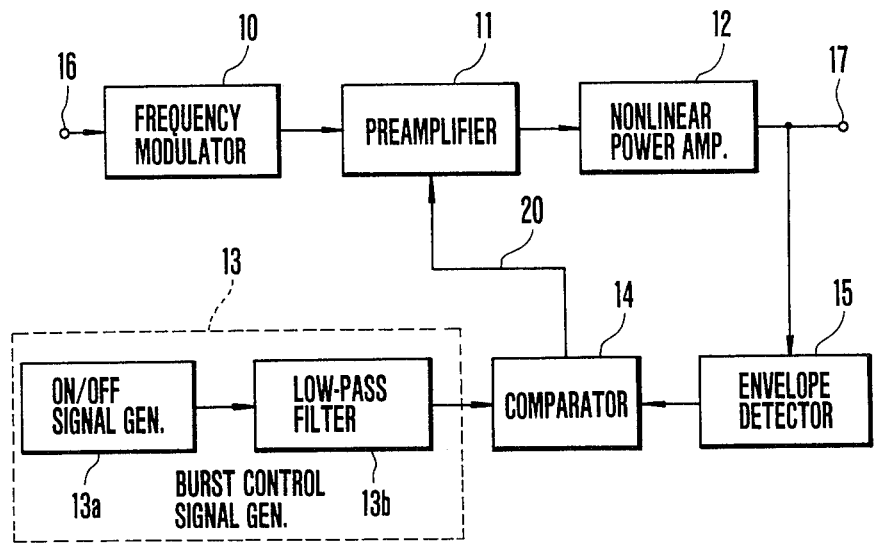
FIG. 3 is a block diagram of a signal control circuit according to a first embodiment of the present invention.

FIG. 3 is a block diagram of a signal control circuit according to a first embodiment of the present invention. An input terminal 16 receiving a baseband signal which has passed through a low-pass filter (not shown) is connected to a frequency modulator 10 which in turn is connected to a preamplifier 11.

The output terminal of the preamplifier 11 is connected to the input terminal of a nonlinear power amplifier (e.g., class C amplifier) 12. The output terminal of the nonlinear power amplifier 12 is connected to an output terminal 17 and to the input terminal of an envelope detector 15. Thus, a main channel comprised of input terminal 16, frequency modulator 10, preamplifier 11, nonlinear power amplifier 12 and output terminal 17 is established. The output terminal of the envelope detector 15 is connected to one input terminal of a comparator 14 comprising a differential amplifier, for example. The output terminal of a burst control signal generator 13 including an ON/OFF signal generator 13a and a low-pass filter 13b is connected to the other input terminal of the comparator 14. The output terminal of the comparator 14 is connected to the gain control terminal of the preamplifier 11 via a line 20. The preamplifier 11, nonlinear power amplifier 12, envelope detector 15, comparator 14 and line 20 constitute a loop, in which the comparator 14, and line 20 constitute means for controlling the main channel.

The main feature of the first embodiment lies in the fact that the controlling means controls the main channel such that the gain of the preamplifer 11 is changed in accordance with an output from the comparator 14. This operation will be described below in more detail.

Figure 2D:

When a baseband signal having a rectangular waveform as shown in FIG. 2a is supplied to the input terminal 16, the burst control signal generator 13 supplies a burst control signal to the other input terminal of the comparator 14. The burst control signal corresponds to an envelope of a carrier to appear at the output terminal 17. The ON/OFF signal generator 13a of control signal generator 13 produces a burst signal of FIG. 2c having steep leading and trailing edges, and this burst signal is passed through the low-pass filter 13b to produce a burst control signal having smoothed leading and trailing edges as shown in FIG. 2d.

The baseband signal is subjected to frequency modulation at the frequency modulator 10 and amplified by the preamplifier 11. The amplified signal is supplied to the nonlinear power amplifier 12 and is amplified to have a high power. The high power signal is supplied to an antenna (not shown) through the output terminal 17. At the same time, this high power signal is also supplied to the envelope detector 15. An output signal from the envelope detector 15 is supplied to the one input terminal of the comparator 14. The comparator 14 compares this signal with the burst control signal from the control circuit 13 and generates a difference signal. The difference signal is supplied to the gain control terminal of the preamplifier 11 via line 20 so as to change the gain of the preamplifier 11.

Figure 2E:

The gain of the preamplifier 11 is changed so as to cancel the difference signal. Therefore, the waveform of the signal from the power amplifier 12 is made similar to that of the burst control signal generated from the burst control signal generator 13, thereby producing an output signal as shown in FIG. 2e. Consequently, the spectrum spread under burst switching can be prevented.

Figure 4:
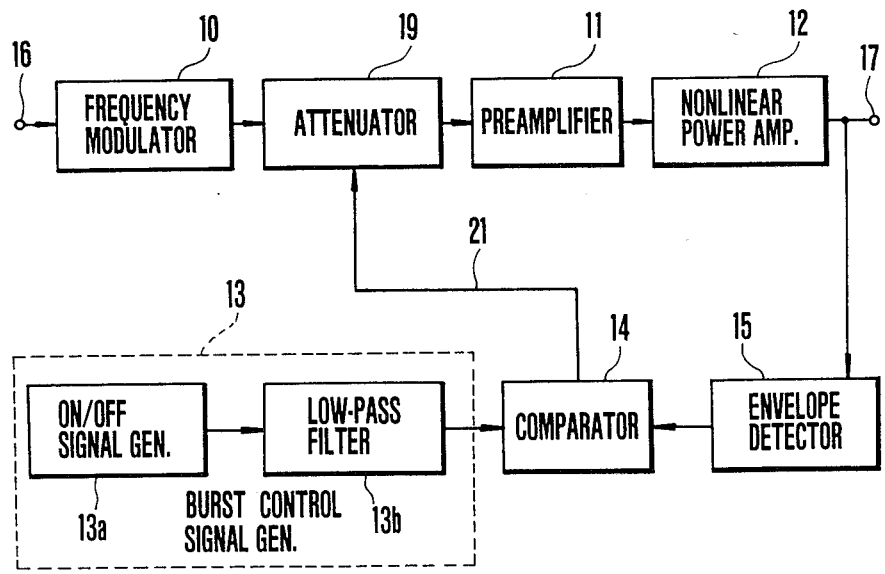
FIG. 4 is a block diagram of a signal control circuit according to a second embodiment of the present invention.

In a second embodiment as shown in FIG. 4, an attenuator 19 is connected between the frequency modulator 10 and the preamplifier 11, and the attenuation of the attenuator 19 is controlled by a difference signal fed thereto via a line 21 from comparator 14. Obviously, substantially the same meritorious effects as those of the first embodiment can be attained. Attenuator 19 may be provided following the preamplifier 11.

A signal control circuit according to a third embodiment of the present invention will be described with reference with FIG. 5. The same reference numerals as used in the first embodiment denote the same parts in the third embodiment. While the gain of the preamplifier 11 is changed in the first embodiment as described above, in the third embodiment the gain of a preamplifier 11 is fixed but power supply voltage applied to a nonlinear power amplifier 12 is controlled to control the gain thereof.

Figure 5:
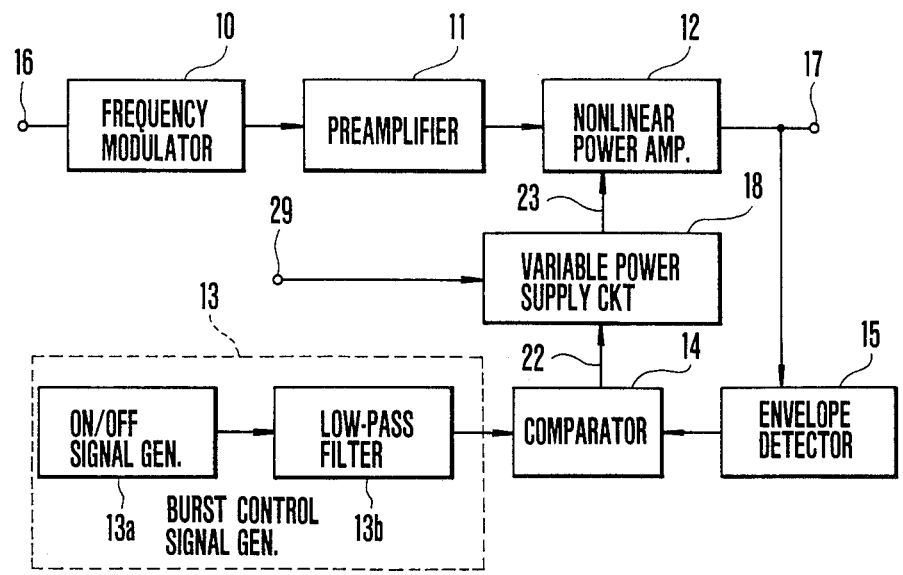
FIG. 5 is a block diagram showing a third embodiment of the present invention.
Figure 6:
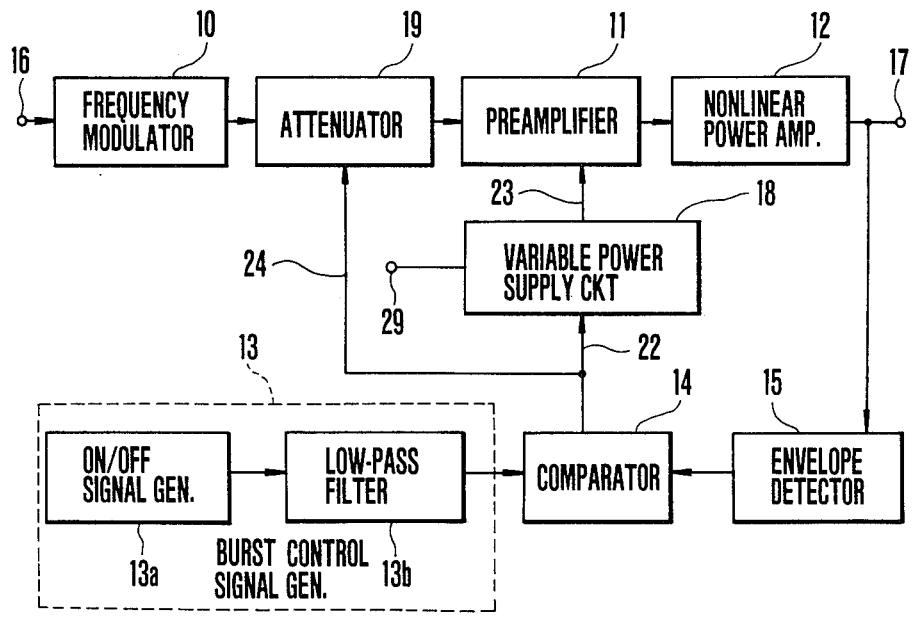
FIG. 6 is a block diagram showing a fourth embodiment of the present invention.

Referring to FIG. 5, an input terminal 16 is connected to the preamplifier 11 through a frequency modulator 10. The output terminal of the preamplifier 11 is connected to a first input terminal of the nonlinear power amplifier 12. The output terminal of the nonlinear power amplifier 12 is connected to an output terminal 17 and to the input terminal of an envelope detector 15. The output terminal of the envelope detector 15 is connected to one input terminal of a comparator 14. The output terminal of a burst control signal generator 13 is connected to the other input terminal of the comparator 14. Unlike the first embodiment wherein the output terminal of the comparator 14 (FIG. 3) is connected to the gain control terminal of the preamplifier 11 (FIG. 3), the output terminal of the comparator 14 in the third embodiment is connected to a second input terminal (gain control terminal) of the nonlinear amplifier 12, through a line 22, a variable power supply circuit 18, and a line 23. An external control voltage is supplied to the variable power supply circuit 18 from a control voltage terminal 29.

In operation, a difference signal from the comparator 14 is supplied to the variable power supply circuit 18. The output voltage level of the variable power supply circuit 18 is changed in accordance with the difference signal from the comparator 14 so as to control the gain of the nonlinear power amplifier 12. The third embodiment provides substantially the same effect as in the first embodiment so as to prevent carrier frequency spectrum spread caused by burst switching.

An attenuator 19 is added to the third embodiment of FIG. 5 to provide a fourth embodiment wherein the difference signal controls attenuation of the attenuator 19 via a line 24 and gain of the nonlinear power amplifier 12 via line 22, variable power supply circuit 18 and line 23. Obviously, the fourth embodiment can attain sunstantially the same effects as in the previous embodiments.

In a system using burst control according to the present invention as described above, an AM communication system can be provided which can provide a higher power than the conventional PSK communication system. Furthermore, the FM communication system has a simple circuit construction in comparison with that of the PSK system.

What is claimed is:

1. A signal control circuit for a burst signal transmission system comprising:
   a main channel including a preamplifier for receiving a modulated carrier signal having a fixed envelope and a nonlinear amplifier for amplifying an output from the preamplifier;
   an envelope detector for detecting an envelope of an output signal from said nonlinear amplifier;
   a burst control signal generator for generating a burst control signal for the modulated carrier signal having smoothed leading and trailing edges; and
   control means, responsive to output signals of said envelope detector and burst control signal generator, for controlling the main channel so that a waveform of the output signal from said nonlinear amplifier is made analogous to that of the burst control signal from said burst control signal generator.

2. A signal control circuit according to claim 1 wherein said preamplifier has a gain control terminal and wherein said control means comprises a comparator, connected to said burst control signal generator and said envelope detector, for comparing an output signal from said envelope detector and the burst control signal from said burst control signal generator to generate a difference signal, and connecting means for connecting the difference signal to said gain control terminal of said preamplifier.

3. A signal control circuit according to claim 1 wherein said burst control signal generator comprises an ON/OFF signal generator for generating an original control signal and a low-pass filter for smoothing leading and trailing edges of the original control signal to thereby produce said burst control signal.

4. A signal control circuit according to claim 1 wherein said main channel further comprises an attenuator, for receiving said modulated carrier signal having a fixed envelope, preceding said preamplifier and said control means comprises a comparator, connected to said control signal generator and said envelope detector, for comparing an output signal from said envelope detector and the burst control signal from said burst control signal generator to generate a difference signal, and connecting means for connecting said difference signal to said attenuator to control attenuation thereof.

5. A signal control circuit according to claim 1 wherein said main channel comprises said nonlinear amplifier having a gain control terminal, and said control means comprises a comparator, connected to said burst control signal generator and said envelope detector, for comparing an output signal from said envelope detector and the burst control signal from said burst control signal generator to generate a difference signal, and first connecting means for connecting the difference signal to the gain control terminal of said nonlinear amplifier.

6. A signal control circuit according to claim 5 wherein said first connecting means comprises a variable power supply circuit responsive to an external control signal and an output voltage level of said variable power supply circuit is changed in accordance with the difference signal from said comparator to control the gain of said nonlinear amplifier.

7. A signal control circuit according to claim 6 wherein said main channel further comprises an attenuator, for receiving said modulated carrier signal having a fixed envelope, preceding said preamplifier and said controlling means further comprises second connecting means for connecting the difference signal to said attenuator to control attenuation thereof.

* * * * *